(12) United States Patent
Kondo

(10) Patent No.: US 9,197,219 B2
(45) Date of Patent: Nov. 24, 2015

(54) ELECTRONIC DEVICE, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/257,242

(22) Filed: Apr. 21, 2014

(65) Prior Publication Data

US 2014/0320221 A1 Oct. 30, 2014

(30) Foreign Application Priority Data

Apr. 25, 2013 (JP) ................................. 2013-092066

(51) Int. Cl.
*H03H 9/08* (2006.01)
*H03L 1/02* (2006.01)
*H03L 1/04* (2006.01)

(52) U.S. Cl.
CPC ................. *H03L 1/028* (2013.01); *H03H 9/08* (2013.01); *H03L 1/04* (2013.01)

(58) Field of Classification Search
CPC ........................................................ H03H 9/08
USPC ............................................. 331/70; 310/343
See application file for complete search history.

(56) References Cited

U.S. PATENT DOCUMENTS

| 5,917,272 | A | * | 6/1999 | Clark et al. | 310/343 |
| 6,133,674 | A | * | 10/2000 | Fry | 310/343 |
| 7,514,852 | B2 | | 4/2009 | Kasahara et al. | |
| 8,049,572 | B2 | | 11/2011 | Arai et al. | |

FOREIGN PATENT DOCUMENTS

| JP | A-7-50523 | 2/1995 |
| JP | A-2007-6270 | 1/2007 |
| JP | A-2009-200817 | 9/2009 |

* cited by examiner

*Primary Examiner* — Joseph Chang
(74) *Attorney, Agent, or Firm* — Oliff PLC

(57) ABSTRACT

An electronic device includes: a substrate; a resonation device; a heating element; a first support which is mounted on the substrate and supports the resonation device; and a second support which supports the substrate, in which the relationship between thermal conductivity $\lambda 1$ of the first support and thermal conductivity $\lambda 2$ of the second support satisfies an expression, $\lambda 1 > \lambda 2$.

8 Claims, 7 Drawing Sheets

ELECTRONIC DEVICE, ELECTRONIC APPARATUS, AND MOVING OBJECT

BACKGROUND

1. Technical Field

The present invention relates to an electronic device, an electronic apparatus, and a moving object.

2. Related Art

In a resonation device such as a quartz crystal resonator with which an oscillator is provided, since a frequency varies according to a change in temperature, a constant temperature type oscillator is used in which the temperature of the resonation device is maintained constant by warming the resonation device by heating means. In such a constant temperature type oscillator, if the resonation device is directly mounted on a substrate configuring a portion of a constant-temperature bath, the heat of the resonation device and the heating means escapes to the substrate. Therefore, it becomes difficult to maintain a constant temperature of the resonation device. Further, it is necessary to further supply electric power to the heating means in order to maintain a constant temperature of the resonation device, and thus there is a problem in that power consumption of the oscillator increases.

In JP-A-2007-6270, a configuration is disclosed in which when a quartz crystal resonator provided with an integrated circuit which includes a heating element is connected and fixed to a substrate by a lead wire, a gap is provided between the substrate and the quartz crystal resonator. Further, in JP-A-2009-200817, a configuration is disclosed in which a quartz crystal resonator disposed to be spaced-apart on a substrate is warmed by a resistor for heat generation formed on a substrate between the quartz crystal resonator and the substrate.

However, in the oscillator described in JP-A-2007-6270, the substrate and the quartz crystal resonator are connected by a bonding wire or a plate-shaped lead wire, whereby the heat of the quartz crystal resonator escapes to the substrate through the bonding wire or the lead wire, and thus it is difficult to maintain a constant temperature of the quartz crystal resonator.

Further, in the constant temperature type crystal oscillator described in JP-A-2009-200817, heat generated by the resistor for heat generation escapes to a second substrate through a metal pin connected to a mounting terminal which is provided in the substrate in which the resistor for heat generation is provided. In addition, heat escapes to a metal base through an airtight terminal which is provided in the second substrate. Therefore, it is difficult to maintain a constant temperature of the quartz crystal resonator, and electric power supply to the resistor for heat generation is increased in order to maintain a constant temperature of the quartz crystal resonator, and thus it is difficult to reduce power consumption of the crystal oscillator.

SUMMARY

An advantage of some aspects of the invention is to solve at least a part of the problems described above, and an aspect of the invention can be implemented as the following forms or application examples.

APPLICATION EXAMPLE 1

This application example is directed to an electronic device including: a substrate; a resonation device; a first support which is mounted on the substrate and supports the resonation device; a second support which supports the substrate; and a heating element, in which the relationship between thermal conductivity $\lambda 1$ of the first support and thermal conductivity $\lambda 2$ of the second support satisfies an expression, $\lambda 1 > \lambda 2$.

According to the electronic device of this application example, the heat of the resonation device warmed by the heating element is transferred to the substrate through the first support. However, heat transfer from the substrate through the second support to a circuit board or the like to which the second support is fixed is suppressed due to the thermal conductivity of the second support being smaller than the thermal conductivity of the first support, and thus it is possible to suppress an escape of the heat transmitted to the substrate. Therefore, it is possible to make a heat gradient between the resonation device and the substrate small, and thus it is possible to easily maintain a constant temperature of the resonation device, that is, to make the temperature of the resonation device be in a constant temperature state. By making the resonation device be in a constant temperature state, it is possible to stabilize the characteristics of the resonation device in which characteristics easily change according to a change in temperature, and thus it is possible to obtain an electronic device which outputs a stable oscillation frequency. Further, an escape of the heat of the resonation device and the substrate to the outside of the electronic device through the second support is suppressed, whereby it is possible to reduce the amount of heating and heating frequency by the heating element, and thus it is possible to obtain an electronic device with low power consumption.

APPLICATION EXAMPLE 2

This application example is directed to the electronic device according to the application example described above, wherein the first support is formed of any one kind of copper, gold, silver, aluminum, and tungsten, or an alloy which includes one or more kinds of these materials, and the second support is formed of any one kind of iron, titanium, and platinum, or an alloy which includes one or more kinds of these materials, or either Kovar or a 42 alloy.

According to this application example, it is possible to easily realize a difference in thermal conductivity between the first support and the second support, that is, the condition of $\lambda 1 > \lambda 2$. Therefore, the resonation device can be made to be in a constant temperature state, and thus it is possible to obtain an electronic device which outputs a stable oscillation frequency and has low power consumption.

APPLICATION EXAMPLE 3

This application example is directed to the electronic device according to the application example described above, wherein the heating element is disposed closer to the first support than the second support.

According to this application example, since the heating element is disposed closer to the first support than the second support, it is possible to more strongly warm the first support than the second support. Accordingly, since the resonation device is warmed by the heating element and heat is also transmitted from the first support, it is possible to further maintain the resonation device in a constant temperature state. In addition, since the second support is disposed farther from the heating element than the first support, warming of the second support is weakened, and thus an escape of heat to the outside through the second support can be suppressed.

APPLICATION EXAMPLES 4 and 5

These application examples are directed to the electronic device according to the application example described above, wherein the heating element is disposed at the resonation device and a circuit which includes an oscillation circuit is disposed on a surface on one side of the substrate.

According to these application examples, the resonation device is provided with the heating element, whereby it is possible to facilitate the warming of the resonation device. Further, a circuit which includes an oscillation circuit having a temperature characteristic is provided on the substrate, whereby heat is transmitted from the resonation device to the substrate through the first substrate, and thus it is also possible to maintain the substrate in a constant temperature state. Therefore, the resonation device and the circuit having a temperature characteristic are maintained in a constant temperature state, whereby it is possible to obtain an electronic device which outputs a stable oscillation frequency and has low power consumption.

APPLICATION EXAMPLE 6

This application example is directed to the electronic device according to the application example described above, wherein a connection region to the substrate of the first support and a connection region to the substrate of the second support do not overlap with each other when viewed in a plane.

According to this application example, a heat conduction pathway between the connection region of the first support which is connected to the substrate and the connection region of the second support which is connected to the substrate is made longer, and thus the heat transmitted from the first support easily stays in the substrate. In this way, the temperature of the substrate is easily maintained constant, and thus a circuit having a temperature characteristic with which the substrate is provided is maintained in a constant temperature state, whereby it is possible to obtain an electronic device which outputs a stable oscillation frequency and has low power consumption.

APPLICATION EXAMPLE 7

This application example is directed to an electronic apparatus including: the electronic device according to the application example described above.

According to the electronic apparatus of this application example, an electronic apparatus provided with an electronic device having stable characteristics and low power consumption can be obtained.

APPLICATION EXAMPLE 8

This application example is directed to a moving object including: the electronic device according to the application example described above.

According to the moving object of this application example, a moving object provided with an electronic device having stable characteristics and low power consumption can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
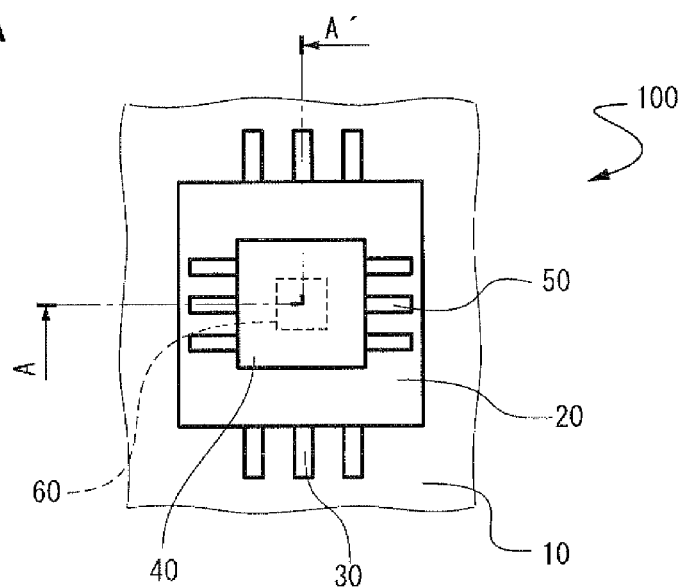
FIG. 1A is a plan view showing an electronic device according to a first embodiment and FIG. 1B is a cross-sectional view taken along line A-A shown in FIG. 1A.
Figure 1B:
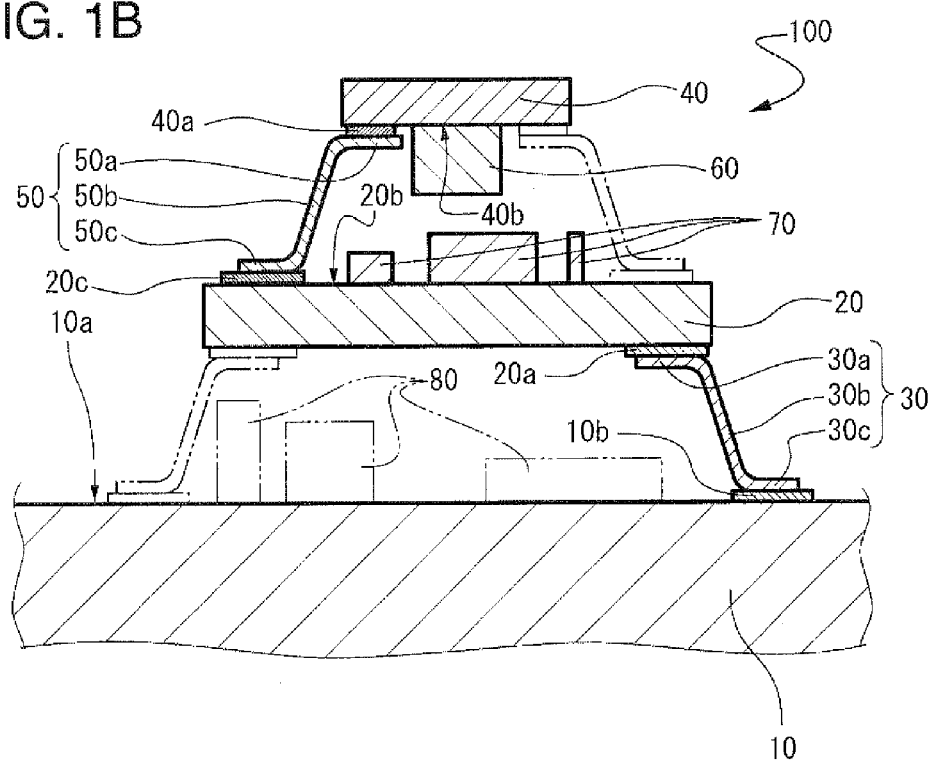

Hereinafter, embodiments according to the invention will be described with reference to the drawings.
First Embodiment An electronic device according to a first embodiment is shown in FIGS. 1A and 1B, in which FIG. 1A is a plan view and FIG. 1B is a cross-sectional view taken along line A-A shown in FIG. 1A. As shown in FIG. 1B, an electronic device 100 is provided with a substrate lead 30 as a second support which supports a substrate 20 on an upper surface 10a of a base 10 and the substrate 20 is supported on and fixed to the base 10. A plurality of substrate leads 30 is connected to the substrate 20, as shown in FIG. 1A, and each substrate lead 20 is provided with a substrate lead connection portion 30a which is connected to an external terminal 20a of an electrode wiring disposed on the substrate 20, a substrate lead base connection portion 30c which is connected to a base electrode wiring terminal 10b (hereinafter referred to as a base terminal 10b) of the base 10, and a substrate lead holding portion 30b which holds the substrate 20 at a distance from the upper surface 10a of the base 10.

A resonation device lead 50 (hereinafter referred to as a device lead 50) as a first support which supports a resonation device 40 is provided on a principal surface 20b as a surface on one side of the substrate 20. A plurality of device leads 50 is connected to the substrate 20, as shown in FIG. 1A, and each device lead 50 is provided with a device lead connection portion 50a which is connected to a device terminal 40a of an electrode wiring disposed on the resonation device 40, a device lead substrate connection portion 50c which is connected to an electrode wiring terminal 20c formed on the principal surface 20b of the substrate 20, and a device lead holding portion 50b which holds the resonation device 40 at a distance from the principal surface 20b of the substrate 20.

In the resonation device 40, a heating element 60 is provided on a heating element installation surface 40b which faces the principal surface 20b of the substrate 20. The heating element 60 is, in this embodiment, an element which includes a power transistor and a thermo sensor (a temperature-sensitive sensor), and is fixed to the heating element installation surface 40b of the resonation device 40 by means of adhesion and the like. In addition, the power transistor and the thermo sensor may be respectively configured as separate chips, and instead of the power transistor, a resistance heating element may be used. Further, the heating element may be configured as a heating element simple body such as a power transistor or a resistance heating element.

The substrate 20 is a circuit board, and a circuit 70 which includes an oscillation circuit of the resonation device 40 is provided on the principal surface 20b of the substrate 20. An oscillation circuit section which oscillates the resonation device 40 and an amplifier circuit section which amplifies a signal from the resonation device 40 may be included in the oscillation circuit which is included in the circuit 70. Further, a frequency-temperature compensation circuit section which compensates the frequency-temperature characteristics of the resonation device 40 may be included in the circuit 70. Further, the base 10 may be a second circuit board, and various electric elements 80 configuring a circuit may be disposed on the upper surface 10a of the base 10.

In the electronic device 100 according to this embodiment, the heating element 60 is provided on the resonation device 40, as described above. In order to stably oscillate the resonation device 40 at a desired frequency, the heating element 60 is controlled so as to constantly maintain the temperature of the resonation device 40 at a temperature set in advance by controlling the supplied power to the power transistor on the basis of a temperature detection result of the thereto sensor provided in the heating element 60. In addition, the temperature control of the heating element 60 described above may be included as a temperature control circuit in the circuit 70 and may be configured as a temperature control circuit in the base 10.

As described above, heat is supplied from the heating element 60 so as to maintain the resonation device 40 at a constant temperature, and on the other hand, the resonation device 40 radiates the supplied heat, or heat is conducted through the device lead 50 connecting the device terminal 40a and the electrode wiring terminal 20c of the substrate 20, thereby being transferred to the substrate 20. Here, the base 10, that is, a circuit board or the like which is configured in an electronic apparatus or the like is connected to the substrate 20 through the substrate lead 30. However, it is preferable to make the substrate lead 30 have a configuration in which heat is not easily conducted, compared to the device lead 50. That is, it is preferable that in a case where the thermal conductivity of the device lead 50 is set to be $\lambda 1$ and the thermal conductivity of the substrate lead is set to be $\lambda 2$, the relationship of $\lambda 1 > \lambda 2$ (Expression (1)) be satisfied.

It is preferable to use any one kind of gold, copper, tungsten, silver, and aluminum or an alloy which includes one or more kinds of these materials, for a material configuring the device lead 50, and use any one kind of iron, titanium, and platinum or an alloy which includes one or more kinds of these materials, for a material configuring the substrate lead 30. Further, it is still preferable to use Kovar or a 42 alloy that is an iron-based alloy.

For example, in a case where copper is used for the device lead 50, the thermal conductivity $\lambda Cu$ of copper is 398 (W/mK), and in a case where Kovar is used for the substrate lead 30, the thermal conductivity $\lambda Ko$ of Kovar is 17 (W/mK). Accordingly, the relationship of $\lambda Cu > \lambda Ko$ is obtained, and thus the above Expression (1) is satisfied. Further, since the thermal conductivity of the substrate lead 30 is about 4% of the thermal conductivity of the device lead 50 and is significantly small, the transfer of heat through the substrate lead 30 from the substrate 20 to the base 10 is suppressed. In addition, a unit of the thermal conductivity described above is as follows.

W: power (watt)
m: meter
K: absolute temperature

In the electronic device 100 according to this embodiment, the heating element 60 is provided on the heating element installation surface 40b which faces the principal surface 20b of the substrate 20, and the circuit 70 is disposed on the substrate 20 so as to face the heating element 60. Also in the circuit 70, in a case where an element or the like in which characteristics change according to a change in temperature, that is, an element or the like having a temperature characteristic is configured, it is preferable to maintain the substrate 20 which includes the circuit 70 in a constant temperature state. Therefore, as described above, even if the heat of the resonation device 40 warmed by the heating element 60 is transferred to the substrate 20 through the device lead 50, heat transfer through the substrate lead 30 from the substrate 20 to the base 10 is suppressed due to the condition shown in Expression (1), and thus it is possible to make the heat stay in the substrate 20.

In addition, the heat of the heating element 60 is transmitted as radiation heat through a space between the heating element 60 and the circuit 70 and warms the circuit 70 and the substrate 20. Accordingly, the resonation device 40 is directly warmed from the heating element 60 and the substrate 20 and the circuit 70 are warmed by the conductive heat of the device lead 50 and the radiation heat of the heating element 60, and thus the resonation device 40, the substrate 20, and the circuit 70 are maintained at a constant temperature. In addition, since the thermal conductivity of the substrate lead 30 connecting the substrate 20 and the base 10 was made small, whereby it is possible to suppress the heat of the substrate 20 from escaping to the base 10, the resonation device 40, the substrate 20, and the circuit 70 are maintained at a constant temperature, and thus it is possible to obtain the electronic device 100 which outputs a stable oscillation frequency.

Figure 2:
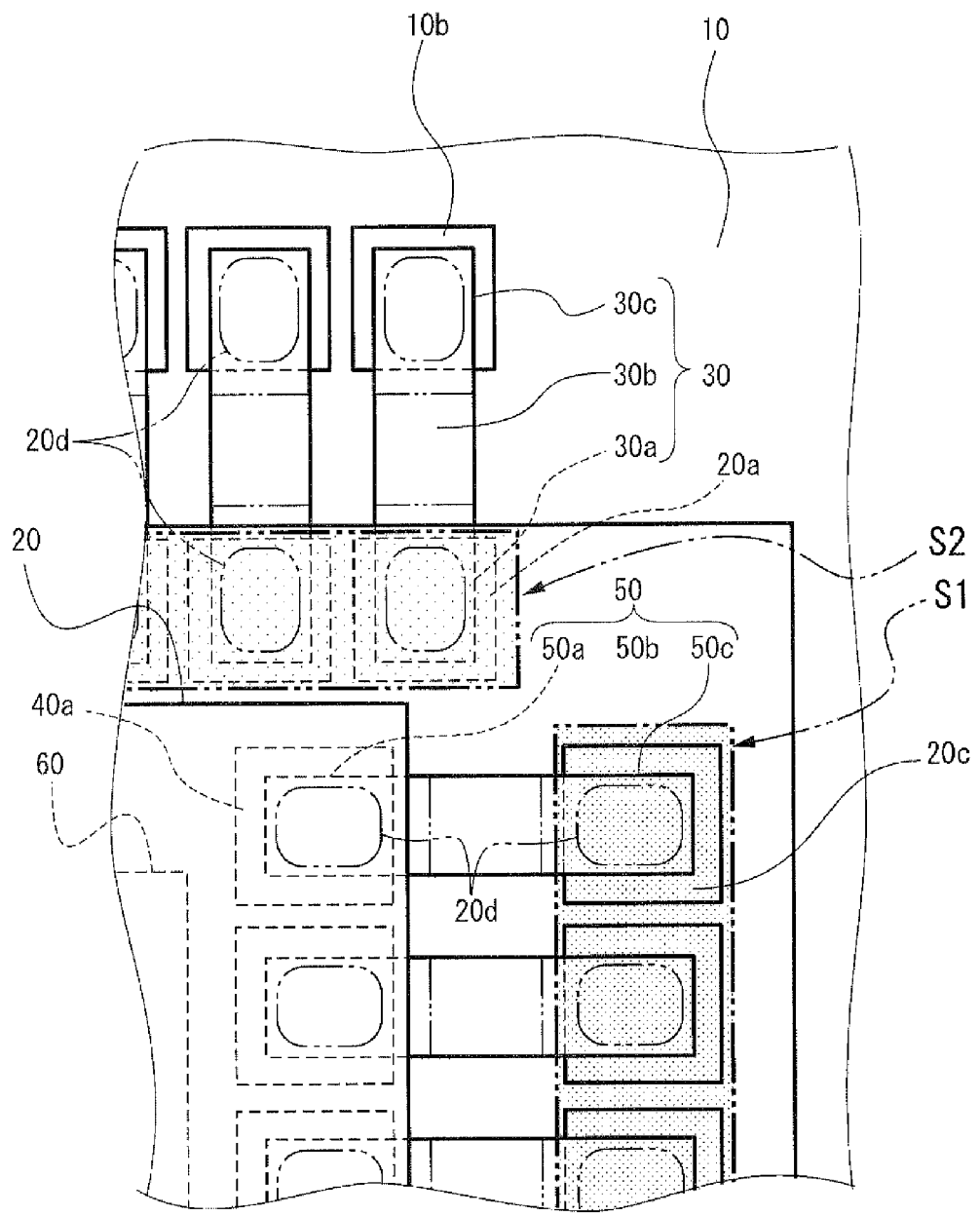
FIG. 2 is a plan view describing the disposition of a substrate lead and a device lead in the electronic device according to the first embodiment.

FIG. 2 is a plan view describing the disposition of the substrate lead 30 and the device lead 50 and is a partial enlarged view of FIG. 1A. As shown in FIG. 2, the device lead is joined to the device terminal 40a with which the resonation device 40 is provided and the electrode wiring terminal 20c with which the substrate 20 is provided, by means of welding or the like, whereby the resonation device 40 is disposed above the substrate 20. In addition, a conductive joint material 20d such as solder, a metal bump, or a conductive adhesive may be used in order to join the device lead 50 to the device terminal 40a, and the electrode wiring terminal 20c with which the substrate 20 is provided. Further, the substrate lead 30 is joined to the external terminal 20a with which the substrate 20 is provided and the base terminal 10b with which the base 10 is provided, by the conductive joint material 20d, whereby the substrate 20 which is provided with the resonation device 40 is disposed above the base 10.

Heat which is retained by the resonation device 40 warmed by the heating element 60 is transmitted from the device terminal 40a of the resonation device 40 to the device lead connection portion 50a of the connected device lead 50, transmitted from the device lead substrate connection portion 50c to the electrode wiring terminal 20c, and flows to the substrate 20. Accordingly, the heat from the resonation device 40 is first transmitted to a region S1 as a connection region where the electrode wiring terminal 20c is disposed. Then, the heat transmitted to the substrate 20 is transmitted to the substrate lead connection portion 30a of the substrate lead 30 which is connected to the external terminal 20a of the substrate 20, the substrate lead holding portion 30b, and the substrate lead base connection portion 30c and flows to the base 10 through the base terminal 10b of the base 10 which is connected to the substrate lead base connection portion 30c.

That is, the heat transmitted to the region S1 of the substrate 20 is transferred to a region S2 as a connection region where the external terminal 20a of the substrate 20 is formed, and is transmitted from the region S2 through the substrate lead 30, thereby flowing to the base 10. Here, as a configuration to allow the heat transmitted to the substrate 20 not to escape to the base 10, in addition to forming the device lead 50 and the substrate lead 30 on the condition of Expression (1) described above, it is preferable to increase a pathway of heat in the substrate 20, that is, the distance between the region S1 and the region S2. In particular, when viewed in a plan view shown in FIG. 2, in a case where a region overlapping with the region S1 and the region S2 occurs, since heat transfers in the shortest pathway, it is preferable to provide a disposition in which the region S1 as the connection region to the substrate 20 of the device lead 50 and the region S2 as the connection region to the substrate 20 of the substrate lead 30 do not overlap when viewed in a plane.

In this example, the heating element 60 is provided on the heating element installation surface 40b of the resonation device 40. However, it is possible to obtain the same effect even in a configuration in which the heating element 60 is disposed closer to the resonation device lead 50 than the substrate lead 30. The heating element 60 is disposed closer to the resonation device lead 50 than the substrate lead 30, whereby it is possible to more strongly warm the resonation device lead 50 than the substrate lead 30. Accordingly, since the resonation device 40 is warmed by the heating element 60 and heat is also transferred from the resonation device lead 50, it becomes possible to further maintain the resonation device 40 and the substrate 20 which includes the circuit 70 in a constant temperature state. On the other hand, since the substrate lead 30 is disposed farther from the heating element than the resonation device lead 50 and the warming of the substrate lead 30 is weakened, heat escaping to the outside through the substrate lead 30 can be suppressed.

Figure 3A:
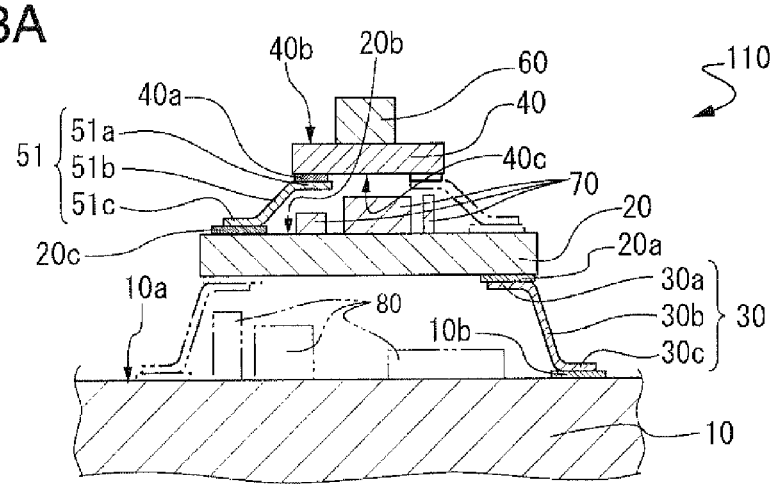
FIGS. 3A to 3C are cross-sectional views showing other forms of the electronic device according to the first embodiment.
Figure 3B:
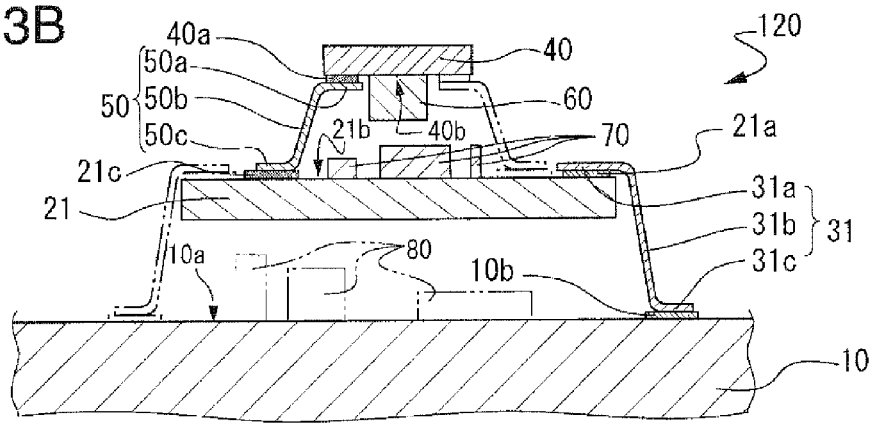
Figure 3C:
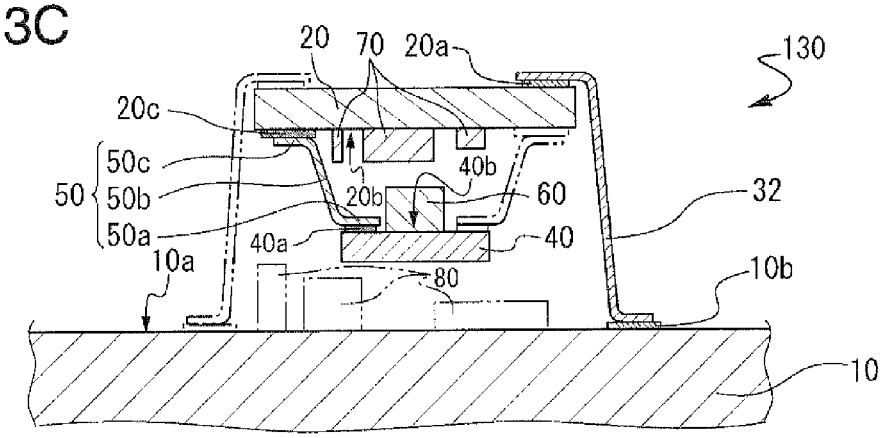

FIGS. 3A to 3C are cross-sectional views showing other forms of the electronic device 100 according to this embodiment. In addition, the same configuration as in the electronic device 100 is denoted by the same reference numeral and description is omitted. An electronic device 110 shown in FIG. 3A has a configuration in which in regard to the electronic device 100 shown in FIGS. 1A and 1B, the heating element installation surface 40b of the resonation device 40 does not face the substrate 20 and the device terminal 40a is provided on a rear surface 40c of the heating element installation surface 40b. Even in a configuration in which the heating element 60 is disposed so as not to face the substrate 20, as in the electronic device 110, the heat of the resonation device 40 warmed by the heat of the heating element 60 is transmitted from a device lead connection portion 51a of a device lead 51 through a device lead holding portion 51b to a device lead substrate connection portion 51c and sent to the substrate 20, thereby being able to warm the substrate 20. In addition, even if the resonation device 40 and the circuit 70 come close to each other or are brought into contact with each other in order to lower the height of the electronic device 110, the heating element 60 does not come close to or come into contact with the circuit 70, and heat generated in the heating element 60 is transmitted to the circuit 70 through the resonation device 40 and the device lead 51, and thus the circuit 70 is not overly heated. Accordingly, characteristic degradation of the circuit 70 which occurs due to being heated more than necessary can be suppressed, and even in the circuit 70 in which an element or the like in which characteristics change according to a change in temperature, that is, an element or the like having a temperature characteristic is configured, since the substrate 20 which includes the circuit 70 is maintained in a constant temperature state, it is possible to obtain the electronic device 110 which outputs a stable oscillation frequency.

In an electronic device 120 shown in FIG. 3B, in regard to the electronic device 100 shown in FIGS. 1A and 1B, an external terminal 21a to which a substrate lead connection portion 31a of a substrate lead 31 is connected is disposed on a principal surface 21b that is a disposition surface of an electrode wiring terminal 21c, to which the device lead 50 is connected, of a substrate 21. Even if the substrate lead connection portion 31a of the substrate lead 31 is connected to the external terminal 21a disposed on the principal surface 21b side of the substrate 21, as in the electronic device 120, the heat of the resonation device 40 warmed by the heat of the heating element 60 is transmitted from the device lead connection portion 50a of the device lead 50 through the device lead holding portion 50b to the device lead substrate connection portion 50c and sent to the substrate 21, and thus a function to maintain the substrate 21 at a constant temperature is the same. However, a substrate lead connection portion is not present on a surface 21d that is a surface opposite to a principal surface of the substrate 21. Therefore, even in a case where the electric element 80 is disposed on the upper surface 10a of the base 10, since the substrate lead connection portion does not interfere with the electric element, the degree of freedom for disposing the electric element 80 increases, and thus electric element layout design becomes easy. Accordingly, it is possible to obtain the electronic device 120 in which the degree of freedom of the disposition of the electric element is high and which outputs a stable oscillation frequency. Further, a configuration is also acceptable in which the substrate 20 connected by the device lead 50 of the electronic device 100 shown in FIGS. 1A and 1B and the resonation device 40 which is provided with the heating element 60 are disposed to be turned upside down and are connected to the base 10 by a substrate lead 32, as in an electronic device 130 shown in FIG. 3C. Due to the configuration as in FIG. 3C, it is possible to obtain a structure in which the resonation device 40, the heating element 60, and the circuit 70 are sandwiched between the base 10 and the substrate 20, and thus a portion that is desired to be maintained at a constant temperature can be disposed in a certain space. Therefore, the heat generated in the heating element 60 is efficiently transmitted to the resonation device 40 and the circuit 70, and thus the resonation device 40 and the circuit 70 can be maintained at a constant temperature and power consumption can be reduced, and it is possible to obtain the electronic device 130 which outputs a stable oscillation frequency.

Figure 4:
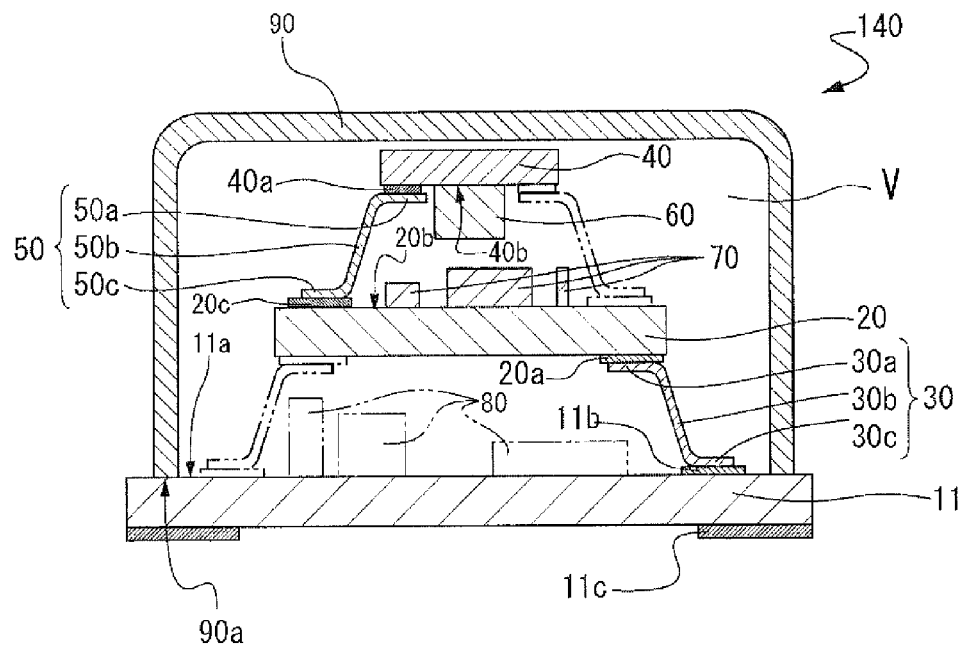
FIG. 4 is a cross-sectional view showing another form of the electronic device according to the first embodiment.

FIG. 4 is a cross-sectional view showing another form of the electronic device 100 according to this embodiment. An electronic device 140 shown in FIG. 4 has a configuration in which the electronic device 100 shown in FIGS. 1A and 1B is hermetically sealed in an accommodating container, and the same configuration as in the electronic device 100 is denoted by the same reference numeral and description is omitted. The electronic device 140 shown in FIG. 4 has a configuration in which a cap 90 is placed on an upper surface 11a (hereinafter referred to as a base principal surface 11a) as a principal surface of a base 11 as a second substrate and a joint portion 90a which is joined to the base principal surface 11a is hermetically fixed by a method such as welding or brazing, thereby hermetically sealing an accommodating space V which is formed by the cap 90 and the base 11.

In the accommodating space V which is hermetically sealed, the substrate lead 30 as the second support which supports the substrate 20 on the base principal surface 11a of the base 11 is provided, and the substrate 20 is supported on and fixed to the base 11. The substrate lead 30 is provided with the substrate lead connection portion 30a which is connected to the external terminal 20a of the electrode wiring disposed on the substrate 20, the substrate lead base connection portion 30c which is connected to a base terminal 11b of the base 11, and the substrate lead holding portion 30b which holds the substrate 20 at a distance from the base principal surface 11a of the base 11. In addition, the base terminal 11b is connected to a base external terminal 11c which is connected to an external circuit, by a wiring (not shown) of the base 11.

Further, the device lead 50 as the first support which supports the resonation device 40 is provided on the principal surface 20b as a surface on one side of the substrate 20. The device lead 50 is provided with the device lead connection portion 50a which is connected to the device terminal 40a of the electrode wiring disposed on the resonation device 40, the device lead substrate connection portion 50c which is connected to the electrode wiring terminal 20c formed on the principal surface 20b of the substrate 20, and the device lead holding portion 50b which holds the resonation device 40 at a distance from the principal surface 20b of the substrate 20. In addition, in the resonation device 40, the heating element 60 is provided on the heating element installation surface 40b which faces the principal surface 20b of the substrate 20.

In the electronic device 140, the hermetically sealed accommodating space V is made to be in, for example, a reduced pressure and vacuum state or a state of being filled with an inert gas, whereby it is possible to obtain a so-called adiabatic effect to suppress the release of heat from the resonation device 40 to the external environment of the cap 90. Therefore, it is possible to make it easy to maintain a constant temperature of the resonation device 40 with respect to the external environment of the cap 90 where a change in temperature is great, and thus it is possible to obtain the electronic device 140 which can stably obtain a desired frequency output. In addition, since suppressing of heat supply from the heating element 60 is also possible, the electronic device 140 with less power consumption can be obtained.

In addition, the substrate lead 30, 31, or 32 and the device lead 50 or 51 in the electronic devices 100, 110, 120, 130, or 140 described above have, in this embodiment, electric connection and a holding unit which mechanically holds the substrate 20 or 21 and the resonation device 40. However, the invention is not limited thereto. For example, a lead which performs electric connection and a holding portion which mechanically holds a substrate and a device may be provided respectively.

Second Embodiment

Figure 5:
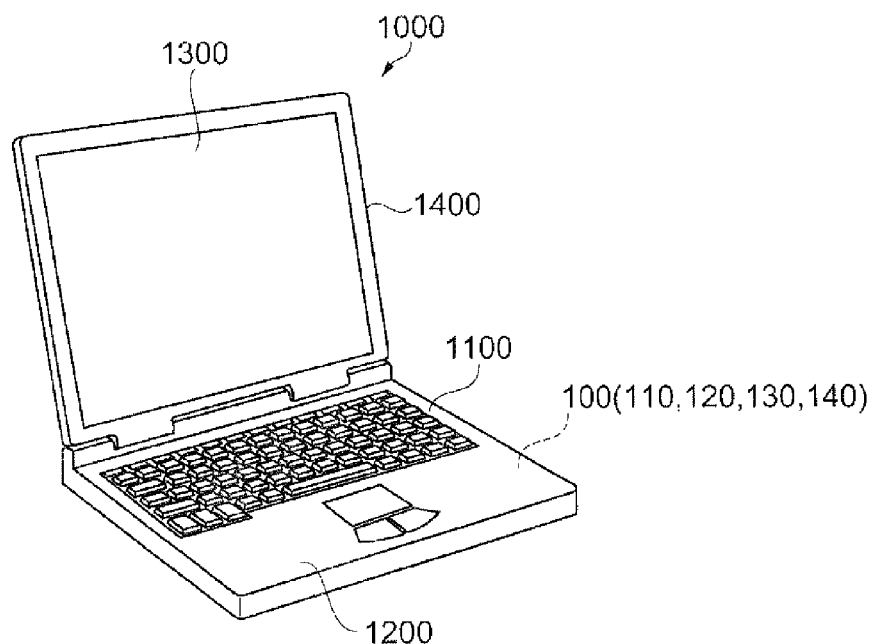
FIG. 5 is a perspective view showing a mobile type personal computer as an electronic apparatus according to a second embodiment.

As a second embodiment, an electronic apparatus will be described which is provided with any one of the electronic devices 100, 110, 120, 130, and 140 according to the first embodiment. FIG. 5 is a perspective view showing a mobile type (or notebook type) personal computer as the electronic apparatus according to the second embodiment. A personal computer 1000 shown in FIG. 5 is provided with a main body section 1200 provided with a keyboard 1100, and a display unit 1400 provided with a display section 1300. The display unit 1400 is held so as to be able to rotate with respect to the main body section 1200 through a hinge structure section. Then, the personal computer 1000 has any one of the electronic devices 100, 110, 120, 130, and 140 built-in as an oscillator for a reference signal or a reference clock.

Figure 6:
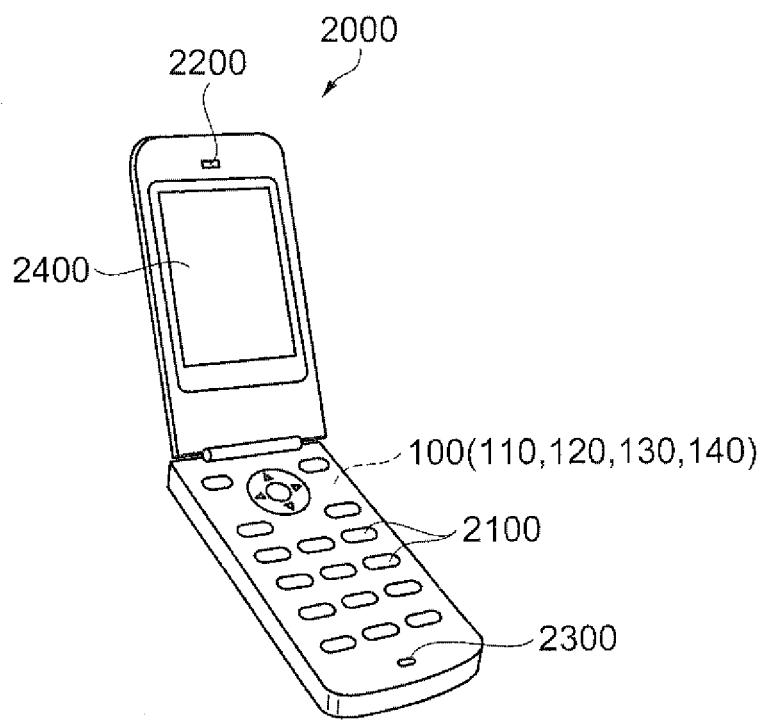
FIG. 6 is a perspective view showing a mobile phone as the electronic apparatus according to the second embodiment.

FIG. 6 is a perspective view showing a mobile phone (also includes a PHS) as the electronic apparatus according to the second embodiment. A mobile phone 2000 shown in FIG. 6 is provided with a plurality of operation buttons 2100, an ear piece 2200, and a mouthpiece 2300, and a display section 2400 is disposed between the operation buttons 2100 and the ear piece 2200. Then, the mobile phone 2000 has any one of the electronic devices 100, 110, 120, 130, and 140 built-in as an oscillator for a reference signal or a reference clock.

Figure 7:
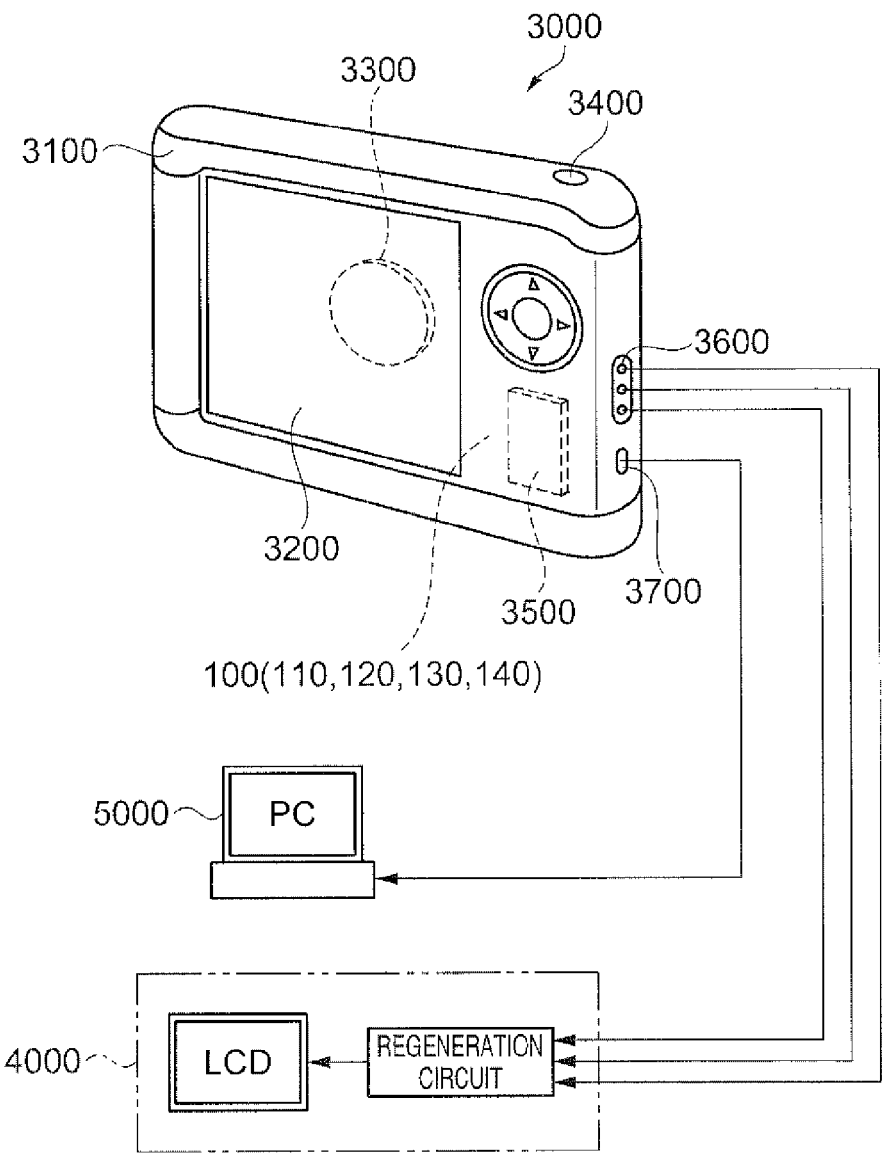
FIG. 7 is a perspective view showing a digital camera as the electronic apparatus according to the second embodiment.

FIG. 7 is a perspective view showing a digital camera as the electronic apparatus according to the second embodiment. In addition, in FIG. 7, connection to external equipment is also shown in a simplified manner. A digital camera 3000 shown in FIG. 7 is provided with a display section 3200 on a plane of a case (a body) 3100, and the display section 3200 performs display on the basis of a imaging signal by a charge coupled device (CCD) and functions as a finder which displays a photographic subject as an electronic image. Further, a light receiving unit 3300 which includes an optical lens (an imaging optical system), the CCD, or the like is provided on the front side (the back side in illustration) of the case 3100.

If a photographer confirms a subject image displayed on the display section 3200 and presses a shutter button 3400, an imaging signal of the CCD at the point of time is transmitted to and stored in a memory 3500. Further, in the digital camera 3000, a video signal output terminal 3600 and an input-output terminal for data communication 3700 are provided on the side surface of the case 3100. Then, as necessary, a television monitor 4000 is connected to the video signal output terminal 3600 and a personal computer 5000 (hereinafter referred to as a PC 5000) is connected to the input-output terminal 3700, and thus image data by the imaging signal stored in the memory 3500 is output to the television monitor 4000 or the PC 5000 by a predetermined operation. Then, the digital camera 3000 has the electronic device 100, 110, 120, 130, or 140 built-in as an oscillator for a reference signal or a reference clock.

In addition, as the electronic apparatus which is provided with the electronic device 100, 110, 120, 130, or 140 according to the first embodiment, for example, equipment can be cited which is applied to an ink jet type discharge device such as an ink jet printer, a laptop type personal computer, a television set, a video camera, a video recorder, a car navigation device, a pager, an electronic notebook with a communication function, an electronic dictionary, an electronic desk calculator, an electronic game machine, a word processor, a workstation, a videophone, a security television monitor, an electronic binocular, a point of sales (POS) terminal, medical equipment (for example, an electronic thermometer, a sphygmomanometer, a blood glucose meter, an electrocardiogram measuring device, an ultrasonic diagnostic device, an electronic endoscope, or the like), a fish finder, various measuring instruments, meters and gauges (for example, meters and gauges of a vehicle, an aircraft, a ship, or the like), a flight simulator, equipment for a mobile communication base station, storage area network equipment such as a router or a switch, local area network equipment, transmission equipment for a network, or the like.

Third Embodiment

Figure 8:
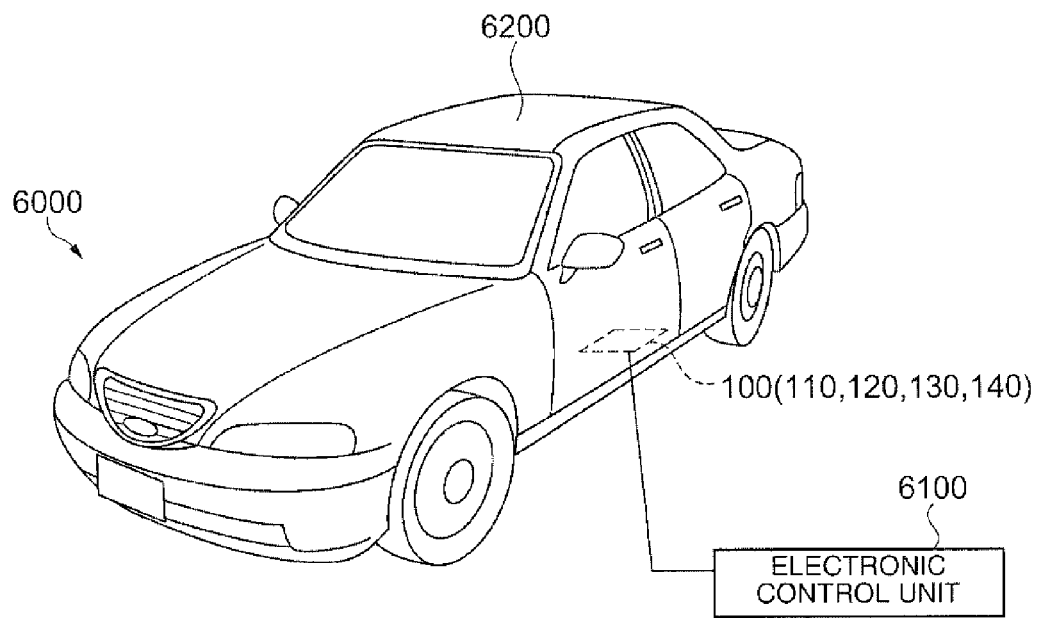
FIG. 8 is a perspective view showing an automobile as a moving object according to a third embodiment.

FIG. 8 is a perspective view showing an automobile as a moving object which is provided with the electronic device 100, 110, 120, 130, or 140 according to the first embodiment. In an automobile 6000 shown in FIG. 8, an electronic control unit 6100 having the electronic device 100, 110, 120, 130, or 140 according to the first embodiment built-in is mounted on a car body 6200. The electronic control unit 6100 is applied as a control unit of, for example, a keyless entry, an immobilizer, a car navigation system, a car air conditioner, an antilock brake system (ABS), an airbag, a tire pressure monitoring system (TPMS), an engine control, a battery monitor of a hybrid car or an electric car, a car body attitude control system, or the like.

The electronic device, the electronic apparatus, and the moving object according to the embodiments described above are not limited thereto and the configuration of each section can be replaced with any configuration having the same function. Further, any other configuration may be added to the embodiments described above and the respective embodiments may be appropriately combined.

The entire disclosure of Japanese Patent Application No. 2013-092066, filed Apr. 25, 2013 is expressly incorporated by reference herein.

What is claimed is:

1. An electronic device comprising:
   a substrate;
   a resonation device;
   a first support which is mounted on the substrate and supports the resonation device;
   a second support which supports the substrate and which is electrically connected to the substrate; and
   a heating element,
   wherein the relationship between thermal conductivity $\lambda 1$ of the first support and thermal conductivity $\lambda 2$ of the second support satisfies an expression, $\lambda 1 > \lambda 2$.

2. The electronic device according to claim 1, wherein
   the first support is formed of any one kind of copper, gold, silver, aluminum, and tungsten, or an alloy which includes one or more kinds of these materials, and
   the second support is formed of any one kind of iron, titanium, and platinum, or an alloy which includes one or more kinds of these materials, or either Kovar or a 42 alloy.

3. The electronic device according to claim 1, wherein
   the heating element is disposed closer to the first support than the second support.

4. The electronic device according to claim 1, wherein
   the heating element is disposed at the resonation device, and
   a circuit which includes an oscillation circuit is disposed on a surface on one side of the substrate.

5. The electronic device according to claim 2, wherein
   the heating element is disposed at the resonation device, and
   a circuit which includes an oscillation circuit is disposed on a surface on one side of the substrate.

6. The electronic device according to claim 1, wherein
   a connection region to the substrate of the first support and a connection region to the substrate of the second support do not overlap each other when viewed in a plane.

7. An electronic apparatus comprising: the electronic device according to claim 1.

8. A moving object comprising: the electronic device according to claim 1.

* * * * *